US009590021B2

(12) United States Patent
 Tang

(10) Patent No.: US 9,590,021 B2
(45) Date of Patent: Mar. 7, 2017

(54) THIN-FILM TRANSISTOR, ARRAY SUBSTRATE, AND DISPLAY DEVICE

(71) Applicant: Shenzhen China Star Optoelectronics Technology Co., Ltd., Shenzhen, Guangdong (CN)

(72) Inventor: Yuejun Tang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 134 days.

(21) Appl. No.: 14/431,710

(22) PCT Filed: Jan. 8, 2015

(86) PCT No.: PCT/CN2015/070351
 § 371 (c)(1),
 (2) Date: Mar. 26, 2015

(87) PCT Pub. No.: WO2016/106805
 PCT Pub. Date: Jul. 7, 2016

(65) Prior Publication Data
 US 2016/0343743 A1  Nov. 24, 2016

(30) Foreign Application Priority Data
 Dec. 30, 2014 (CN) .......................... 2014 1 0853562

(51) Int. Cl.
 *H01L 27/32* (2006.01)
 *H01L 27/12* (2006.01)
 (Continued)

(52) U.S. Cl.
 CPC ........ *H01L 27/3262* (2013.01); *H01L 27/124* (2013.01); *H01L 27/1248* (2013.01);
 (Continued)

(58) Field of Classification Search
 CPC ... H01L 29/78; H01L 29/7803; H01L 29/786; H01L 29/7842; H01L 29/78686;
 (Continued)

(56) References Cited

U.S. PATENT DOCUMENTS 6,168,979 B1 * 1/2001 Kim ........................ H01L 21/84
 257/347
2002/0196387 A1 * 12/2002 Kimura ............. G02F 1/133603
 349/61
2016/0240565 A1 * 8/2016 Kim .................... H01L 27/1251

* cited by examiner

*Primary Examiner* — Eduardo A Rodela
(74) *Attorney, Agent, or Firm* — Andrew C. Cheng

(57) ABSTRACT

A thin-film transistor includes a gate, a first source, a second source, a first drain, a second drain, a first semiconductor layer, a second semiconductor layer, a first insulation layer, and a second insulation layer. The gate includes a first surface and a second surface that are opposite to each other. The first insulation layer is formed on the first surface and covers the first surface. The first semiconductor layer is formed on the first insulation layer. The first drain and the first source are formed on the first semiconductor layer in a spaced manner. The second insulation layer is formed on the second surface and covers the second surface. The second semiconductor layer is formed on the second insulation layer. The second drain and the second source re formed on the second semiconductor layer in a spaced manner. Also disclosed are an array substrate and a display device.

18 Claims, 5 Drawing Sheets

(51) Int. Cl.
*H01L 29/417* (2006.01)
*H01L 29/423* (2006.01)
*H01L 29/786* (2006.01)

(52) U.S. Cl.
CPC ........ *H01L 27/326* (2013.01); *H01L 27/3241* (2013.01); *H01L 27/3297* (2013.01); *H01L 29/41733* (2013.01); *H01L 29/42384* (2013.01); *H01L 29/78669* (2013.01); *H01L 29/78678* (2013.01)

(58) Field of Classification Search
CPC ... H01L 27/32; H01L 27/105; H01L 27/3241; H01L 27/326; H01L 27/3262; H01L 27/3297
See application file for complete search history.

THIN-FILM TRANSISTOR, ARRAY SUBSTRATE, AND DISPLAY DEVICE

CROSS REFERENCE TO RELATED APPLICATIONS

This application claims the priority of Chinese Patent Application No. 201410853562.0, entitled "Thin-Film Transistor, Array Substrate, and Display Device", filed on Dec. 30, 2014, the disclosure of which is incorporated herein by reference in its entirety.

BACKGROUND OF THE INVENTION

1. Field of the Invention

The present invention relates to the field of electronics, and in particular to a thin-film transistor, an array substrate, and a display device.

2. The Related Arts

Thin-film transistors are one of the key electronic components of the modern microelectronics and have been widely used in various fields including flat panel displays. With the advancing progress of the liquid crystal displaying technology, the image sampling rate of a panel of a liquid crystal display has been increasingly heightened. On the other hand, there is also severe demand for the aperture ratio of the liquid crystal display panel. The term "aperture ratio" refers to a ratio between light transmission area measured with wiring of a sub-pixel and a transistor section (often concealed by using a black matrix) excludes and the whole area of the entirety of the sub-pixel. However, with the increasingly heighted image sampling rate, the panel of the liquid crystal display require more thin-film transistors and this affects the aperture rate of the panel of the liquid crystal display.

SUMMARY OF THE INVENTION

The technical solution to be addressed in the present invention is to provide a thin-film transistor, an array substrate, and a display device, which help increase the aperture ratio of the display device.

To achieve the above object, embodiments of the present invention provide the following technical solutions:

The present invention provides a thin-film transistor, which comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner.

In the above thin-film transistor, the first source corresponds to the second source and the first drain corresponds to the second drain.

In the above thin-film transistor, the first and second insulation layers comprise materials of silicon nitride, silicon oxide, benzocyclobutene, polyester, or acrylic resin.

In the above thin-film transistor, the gate, the first and second sources, and the first and second drains comprise materials of metal, alloy, conductive polymer, or conductive carbon nanotube.

The present invention also provides an array substrate, which comprises a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner.

In the above array substrate, the first electrode and the second electrode are strip electrodes and located on the same layer.

In the above array substrate, the first electrode is a block electrode, the second electrode being a strip electrode, the first electrode being spaced from the substrate by a distance that is smaller than a distance by which the second electrode is spaced from the substrate, the first electrode and the second electrode being located at different layers.

In the above array substrate, the array substrate comprises a primary pixel zone and a secondary pixel zone that are located on the same layer, the first electrode being located in the first pixel zone, the second electrode being located in the second pixel zone.

In the above array substrate, the first electrode is a strip electrode and the second electrode is a block electrode.

In the above array substrate, the first source corresponds to the second source and the first drain corresponds to the second drain.

In the above array substrate, the first and second insulation layers comprise materials of silicon nitride, silicon oxide, benzocyclobutene, polyester, or acrylic resin.

In the above array substrate, the gate, the first and second sources and the first and second drains comprise materials of metal, alloy, conductive polymer, or conductive carbon nanotube.

The present invention further provides a display device, which comprises an array substrate, the array substrate comprising a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner.

In the above display device, the first electrode and the second electrode are strip electrodes and located on the same layer.

In the above display device, the first electrode is a block electrode, the second electrode being a strip electrode, the first electrode being spaced from the substrate by a distance that is smaller than a distance by which the second electrode is spaced from the substrate, the first electrode and the second electrode being located at different layers.

In the above display device, the array substrate comprises a primary pixel zone and a secondary pixel zone that are located on the same layer, the first electrode being located in the first pixel zone, the second electrode being located in the second pixel zone.

In the above display device, the first electrode is a strip electrode and the second electrode is a block electrode.

In the above display device, the first source corresponds to the second source and the first drain corresponds to the second drain.

In the above display device, the first and second insulation layers comprise materials of silicon nitride, silicon oxide, benzocyclobutene, polyester, or acrylic resin.

In the above display device, the gate, the first and second sources and the first and second drains comprise materials of metal, alloy, conductive polymer, or conductive carbon nanotube.

The present invention provides a thin-film transistor, which comprises a gate, a first source, a second source, a first drain, a second drain, a first semiconductor layer, a second semiconductor layer, a first insulation layer, and a second insulation layer. The gate comprises a first surface and a second surface that are opposite to each other. The first insulation layer is formed on the first surface and covers the first surface. The first semiconductor layer is formed on the first insulation layer. The first drain and the first source are formed on the first semiconductor layer in a spaced manner. The second insulation layer 18 formed on the second surface and covers the second surface. The second semiconductor layer is formed on the second insulation layer. The second drain and the second source are formed on the second semiconductor layer in a spaced manner. As such, the first and second sources and the first and second drains share a common gate of the thin-film transistor. Controlling the gate would simultaneously control conduction-on and shut-down of the first source and the first drain and conduction-on and shut-down of the second source and the second drain. In other words, the thin-film transistor may serve as two independent thin-film transistors. Thus, when the thin-film transistor 100 of the present invention is used in an array substrate of a display device, the number of thin-film transistors used can be reduced, and this means the number of the thin-film transistor s that blocks light transmission is reduced. Thus, the present invention helps heighten the aperture of the display device.

BRIEF DESCRIPTION OF THE DRAWINGS

To more clearly explain the technical solution proposed in the present invention, a brief description of the drawings that are necessary for describing embodiments is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution proposed in an embodiment of the present invention with reference to the attached drawings of the embodiment of the present invention.

Figure 1:
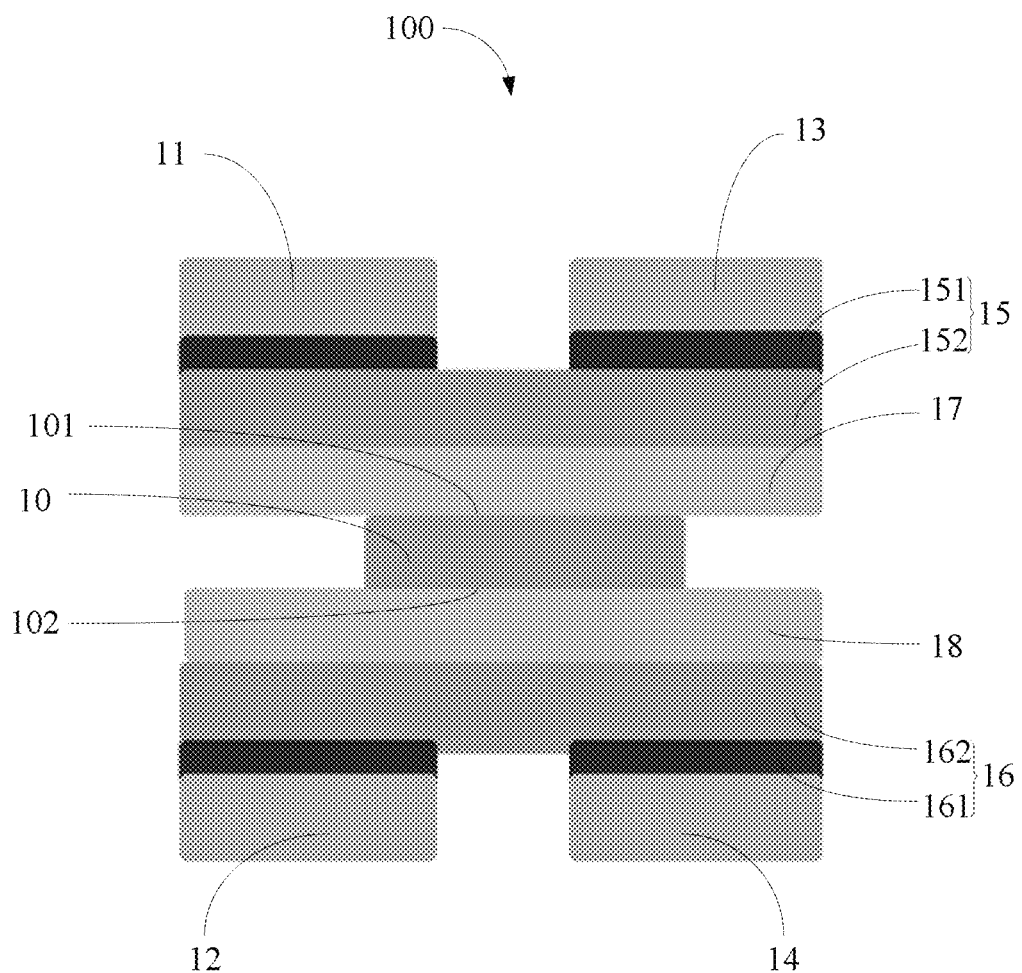
FIG. 1 is a cross-sectional view of a portion of a thin-film transistor according to a preferred embodiment provided by a first aspect of the present invention.

Referring to FIG. 1, a preferred embodiment of a first aspect of the present invention provides a thin-film transistor 100. The thin-film transistor 100 comprises a gate 10, a first source 11, a second source 12, a first drain 13, a second drain 14, a first semiconductor layer 15, a second semiconductor layer 16, a first insulation layer 17, and a second insulation layer 18. The gate 10 comprises a first surface 101 and a second surface 102 that are opposite to each other. The first insulation layer 17 is formed on the first surface 101 and covers the first surface 101. The first semiconductor layer 15 is formed on the first insulation layer 17. The first drain 13 and the first source 11 are formed on the first semiconductor layer 15 in a spaced manner. The second insulation layer 18 is formed on the second surface 102 and covers the second surface 102. The second semiconductor layer 16 is formed on the second insulation layer 18. The second drain 14 and the second source 12 are formed on the second semiconductor layer 16 in a spaced manner.

The first source 11 corresponds to the second source 12. The first drain 13 corresponds to the second drain 14.

It is noted here that the thin-film transistor 100 is arranged on an array substrate. The first source 11 corresponding to the second source 12 and the first drain 13 corresponding to the second drain 14 refers to a projection of the first source 11 on the array substrate is coincident with a projection of the second source 12 on the array substrate; and a projection of the first drain 13 on the array substrate is coincident with a projection of the second drain 14 on the array substrate.

Specifically, the first semiconductor layer 15 comprises a first ohmic contact layer 151 and a first active layer 152. The first active layer 152 is formed on the first insulation layer 17. The first ohmic contact layer 151 is formed between the first source 11 and the first drain 13 and the first active layer 152. The first ohmic contact layer 151 comprises a first spacing zone. The first spacing zone corresponds to the spacing between the first source 11 and the first drain 13. Similarly, the second semiconductor layer 116 comprises a second ohmic contact layer 161 a the second active layer 162. The second active layer 162 is formed on the second insulation layer 18. The second ohmic contact layer 161 is formed between the second source 12 and the second drain 14 and the second active layer 162. The second ohmic contact layer 161 comprises a second spacing zone. The second spacing zone corresponds to the spacing between the second source 12 and the second drain 14.

In the instant embodiment, the first and second insulation layers 17, 18 comprise materials of silicon nitride, silicon oxide, benzocyclobutene, polyester, or acrylic resin. The gate 10, the first source 11, the second source 12, the first drain 13, and the second drain 14 comprise materials of metal, alloy, conductive polymer, or conductive carbon nanotube.

In the embodiment, the thin-film transistor 100 comprises the gate 10, the first source 11, the second source 12, the first drain 13, the second drain 14, the first semiconductor layer 15, the second semiconductor layer 16, the first insulation layer 17, and the second insulation layer 18. The gate 10 comprises the first surface 101 and the second surface 102 that are opposite to each other. The first insulation layer 17 is formed on the first surface 101 and covers the first surface 101. The first semiconductor layer 15 is formed on the first insulation layer 17. The first drain 13 and the first source 11 are formed on the first semiconductor layer 15 in a spaced manner. The second insulation layer 18 is formed on the second surface 102 and covers the second surface 102. The second semiconductor layer 16 is formed on the second insulation layer 18. The second drain 14 and the second source 12 are formed on the second semiconductor layer 16 in a spaced manner. As such, the first and second sources 11, 12 and the first and second drains 13, 14 share a common gate 10 of the thin-film transistor 100. Controlling the gate 10 would simultaneously control conduction-on and shut-down of the first source 11 and the first drain 13 and conduction-on and shut-down of the second source 12 and the second drain 14. In other words, the thin-film transistor 100 may serve as two independent thin-film transistors. Thus, when the thin-film transistor 100 of the present invention is used in an array substrate of a display device, the number of thin-film transistors used can be reduced, and this means the number of the thin-film transistor 100 that blocks light transmission is reduced. Thus, the present invention helps heighten the aperture of the display device.

Figure 2:
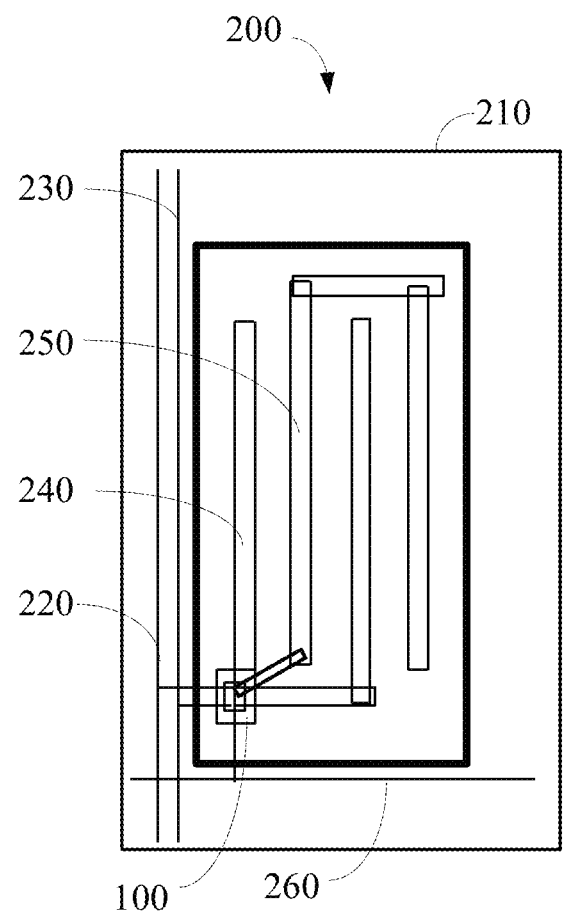
FIG. 2 is a schematic view showing an array substrate according to a first preferred embodiment provided by a second aspect of the present invention.

Referring next to FIG. 2, a first preferred embodiment of a second aspect of the present invention provides an array substrate 200. The array substrate 200 comprises a substrate 210 having a first surface and a first data line 220, a second data line 230, a gate line 260, a first electrode 240, a second electrode 250, and a thin-film transistor formed on the first surface of the substrate 210.

The thin-film transistor can be the thin-film transistor 100 provided by the preferred embodiment of the first aspect described above. Details of the specific structure of the thin-film transistor 100 have been given above with reference to the first aspect of the present invention so that repeated description will be omitted here.

The gate line 260 is connected to the gate 10. The first data line 220 and the first electrode 240 are respectively connected to the first source 11 and the first drain 13. The second data line 230 and the second electrode 250 are respectively connected to the second source 12 and the second drain 14. Using the gate line 260 to control the gate 10 would control conduction-on and shut-down of the first source 11 and the first drain 13 and also, at the same time, control the conduction-on and shut-down of the source 12 and the second drain 14.

In the instant embodiment, the first electrode 240 and the second electrode 250 are both strip electrodes and are located on the same layer. In other embodiments, the first electrode 240 and the second electrode 250 can be set on different layers.

Thus, for the array substrate 200, one thin-film transistor can be connected to the two electrodes so that the number of thin-film transistors used can be reduced, and this means the number of the thin-film transistor 100 that blocks light transmission is reduced. Thus, the array substrate 200, when used in a display device, helps heighten the aperture of the display device.

Figure 3:
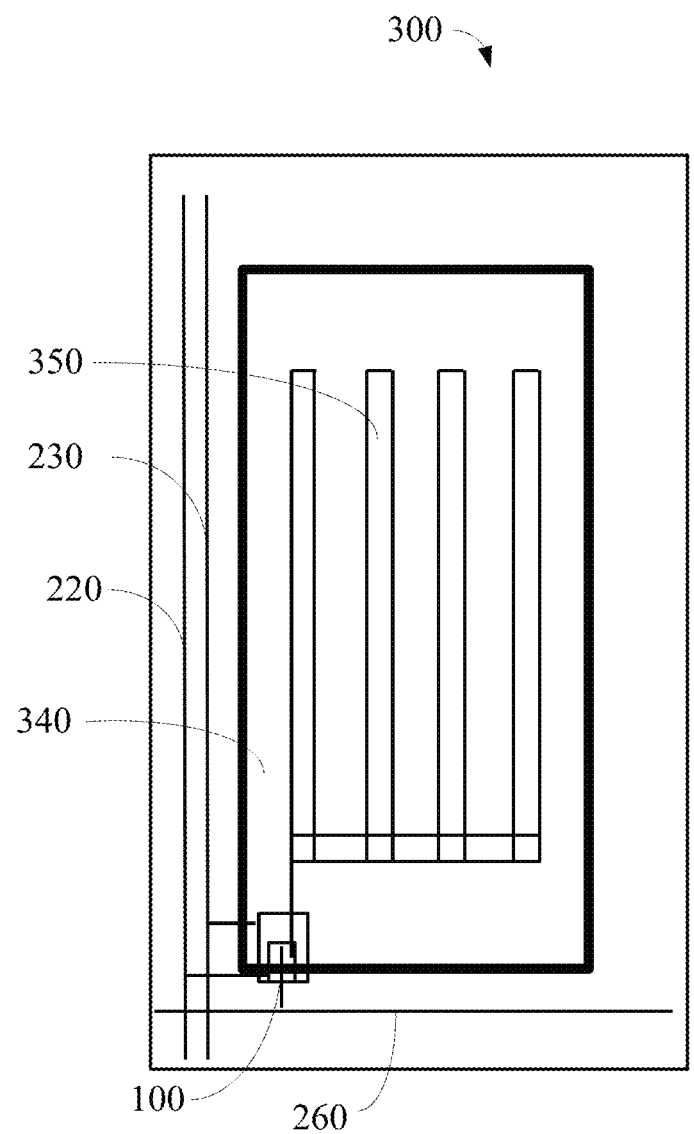
FIG. 3 is a schematic view showing an array substrate according to a second preferred embodiment provided by the second aspect of the present invention.

Referring subsequently to FIG. 3, a second preferred embodiment of the second aspect of the present invention provides an array substrate 300, which is similar to the array substrate 200 provided by the first preferred embodiment of the second aspect and the difference between them is that the first electrode 340 is also a block electrode. The second electrode 350 is a strip electrode. The first electrode 340 is spaced from the array substrate by a distance that is smaller than a distance by which the second electrode 350 is spaced from the substrate. The first electrode 340 and the second electrode 350 are located on different layers.

It is noted that the distance that the first electrode 340 is spaced from the array substrate being smaller than the distance that the second electrode 350 is spaced from the substrate is discussed for the purpose of explaining that the block electrode is arranged beneath the strip electrode. The first electrode 340 and the second electrode 350 can be a common electrode and/or a pixel electrode and are not limited thereto here.

Figure 4:
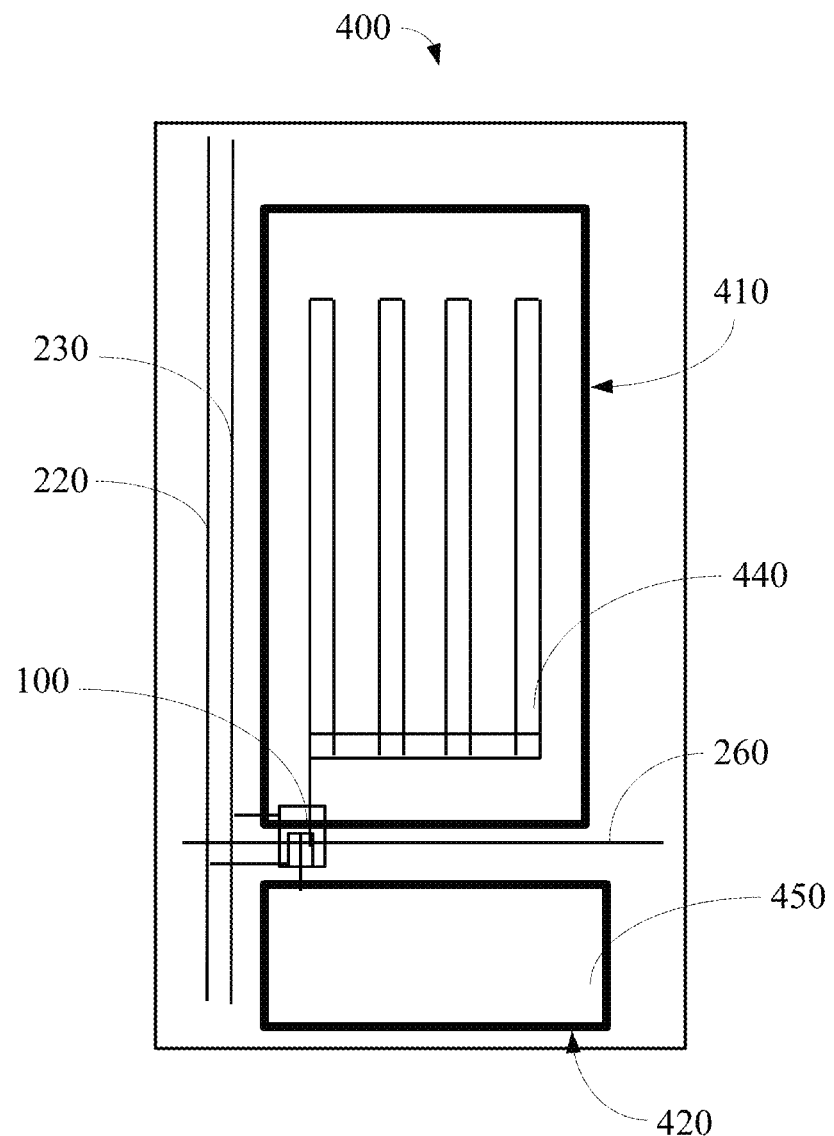
FIG. 4 is a schematic view showing an array substrate according to a third preferred embodiment provided by the second aspect of the present invention.

Referring subsequently to FIG. 4, a third preferred embodiment of the second aspect of the present invention provides an array substrate 400, which is similar to the array substrate 200 provided by the first preferred embodiment of the second aspect and the difference between them is that the array substrate 400 comprises a primary pixel zone 410 and a secondary pixel zone 420 that are on the same layer. The first electrode 440 is located in the first pixel zone 410. The second electrode 450 is located in the second pixel zone 420.

In the instant embodiment, the first electrode 440 is a strip electrode. The second electrode is a block electrode.

In the instant embodiment, for the array substrate 400, one thin-film transistor can be connected to the two electrodes so that the number of thin-film transistors used can be reduced, and this means the number of the thin-film transistor 100 that blocks light transmission is reduced. Thus, the array substrate 400, when used in a display device, helps heighten the aperture of the display device.

Figure 5:
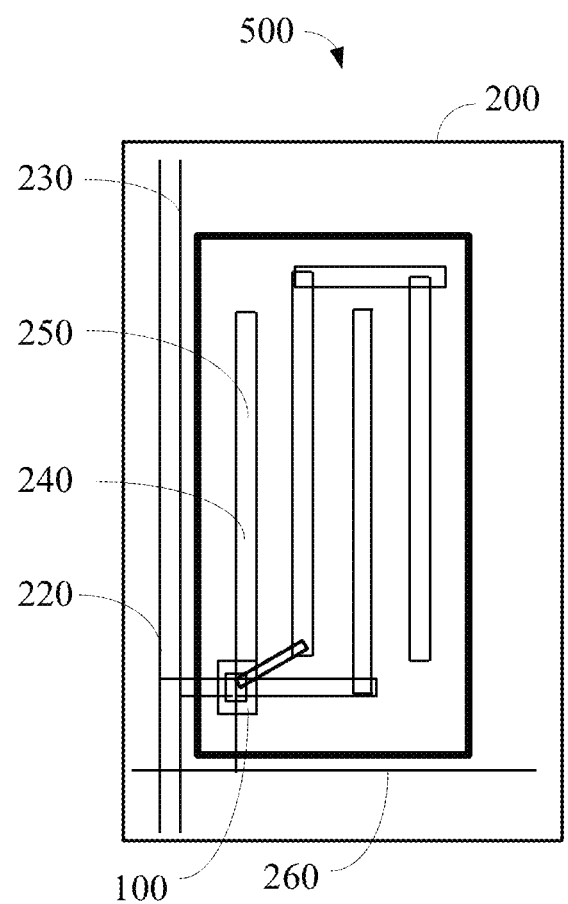
FIG. 5 is a schematic view showing a display device according to a preferred embodiment provided by a third aspect of the present invention.

Referring subsequently to FIG. 5, a preferred embodiment of a third aspect of the present invention provides a display device 500. The display device 500 comprises the array substrate 200. Since in the discussion provided above with reference to the second aspect, details of the array substrate 200 have been illustrated, repeated description will be omitted here. In the instant embodiment, the array substrate 200 can be an array substrate provided by any one of the preferred embodiments of the second aspect.

In the instant embodiment (when considered in combination with FIGS. 1 and 2), the thin-film transistor 100 comprises the gate 10, the first source 11, the second source 12, the first drain 13, the second drain 14, the first semiconductor layer 15, the second semiconductor layer 16, the first insulation layer 17, and the second insulation layer 18. The gate 10 comprises the first surface 101 and the second surface 102 that are opposite to each other. The first insulation layer 17 is formed on the first surface 101 and covers the first surface 101. The first semiconductor layer 15 is formed on the first insulation layer 17. The first drain 13 and the first source 11 are formed on the first semiconductor layer 15 in a spaced manner. The second insulation layer 18 is formed on the second surface 102 and covers the second surface 102. The second semiconductor layer 16 is formed on the second insulation layer 18. The second drain 14 and the second source 12 are formed on the second semiconductor layer 16 in a spaced manner. As such, the first and second sources 11, 12 and the first and second drains 13, 14 share a common gate 10 of the thin-film transistor 100. Controlling the gate 10 would simultaneously control conduction-on and shut-down of the first source 11 and the first drain 13 and conduction-on and shut-down of the second source 12 and the second drain 14. In other words, the thin-film transistor 100 may serve as two independent thin-film transistors. Thus, the present invention helps reduce the number of thin-film transistors used, and this means the number of the thin-film transistor 100 that blocks light transmission is reduced. Thus, the present invention helps heighten the aperture of the display device 500.

Disclosed above is a preferred embodiment of the present invention. It is appreciated that those having ordinary skills of the art may readily appreciate that various improvements and modifications without departing the principle of the present invention. These improvements and modifications are considered within the protection scope covered by the present invention.

What is claimed is:

1. An array substrate, comprising a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner;

wherein the first electrode is a block electrode, the second electrode being a strip electrode, the first electrode being spaced from the substrate by a distance that is smaller than a distance by which the second electrode is spaced from the substrate, the first electrode and the second electrode being located at different layers.

2. The array substrate as claimed in claim 1, wherein the first source corresponds to the second source and the first drain corresponds to the second drain.

3. The array substrate as claimed in claim 1, wherein the first and second insulation layers comprise materials of silicon nitride, silicon oxide, benzocyclobutene, polyester, or acrylic resin.

4. The array substrate as claimed in claim 1, wherein the gate, the first and second sources and the first and second drains comprise materials of metal, alloy, conductive polymer, or conductive carbon nanotube.

5. An array substrate, comprising a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner;

wherein the array substrate comprises a primary pixel zone and a secondary pixel zone that are located on the same layer, the first electrode being located in the first pixel zone, the second electrode being located in the second pixel zone.

6. The array substrate as claimed in claim 5, wherein the first electrode is a strip electrode and the second electrode is a block electrode.

7. The array substrate as claimed in claim 5, wherein the first source corresponds to the second source and the first drain corresponds to the second drain.

8. The array substrate as claimed in claim 5, wherein the first and second insulation layers comprise materials of silicon nitride, silicon oxide, benzocyclobutene, polyester, or acrylic resin.

9. The array substrate as claimed in claim 5, wherein the gate, the first and second sources and the first and second drains comprise materials of metal, alloy, conductive polymer, or conductive carbon nanotube.

10. A display device, comprising an array substrate, the array substrate comprising a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner;

wherein the first electrode is a block electrode, the second electrode being a strip electrode, the first electrode being spaced from the substrate by a distance that is smaller than a distance by which the second electrode is spaced from the substrate, the first electrode and the second electrode being located at different layers.

11. The display device as claimed in claim 10, wherein the first source corresponds to the second source and the first drain corresponds to the second drain.

12. The display device as claimed in claim 10, wherein the first and second insulation layers comprise materials of silicon nitride, silicon oxide, benzocyclobutene, polyester, or acrylic resin.

13. The display device as claimed in claim 10, wherein the gate, the first and second sources and the first and second drains comprise materials of metal, alloy, conductive polymer, or conductive carbon nanotube.

14. A display device, comprising an array substrate, the array substrate comprising a substrate having a first surface and a first data line, a second data line, a gate line, a first electrode, a second electrode, and a thin-film transistor formed on the first surface of the substrate, wherein the gate line is connected to the gate, the first data line and the first electrode being respectively connected to the first source and the first drain, the second data line and the second electrode being respectively connected to the second source and the second drain; and wherein the thin-film transistor comprises a gate, a first source, a second source, a first drain, a second drain, a first semiconductor layer, a second semiconductor layer, a first insulation layer, and a second insulation layer, the gate comprising a first surface and a second surface that are opposite to each other, the first insulation layer being formed on the first surface and covering the first surface, the first semiconductor layer being formed on the first insulation layer, the first drain and the first source being formed on the first semiconductor layer in a spaced manner, the second insulation layer being formed on the second surface and covering the second surface, the second semiconductor layer being formed on the second insulation layer, the second drain and the second source being formed on the second semiconductor layer in a spaced manner;

wherein the array substrate comprises a primary pixel zone and a secondary pixel zone that are located on the same layer, the first electrode being located in the first pixel zone, the second electrode being located in the second pixel zone.

15. The display device as claimed in claim 14, wherein the first electrode is a strip electrode and the second electrode is a block electrode.

16. The display device as claimed in claim 14, wherein the first source corresponds to the second source and the first drain corresponds to the second drain.

17. The display device as claimed in claim 14, wherein the first and second insulation layers comprise materials of silicon nitride, silicon oxide, benzocyclobutene, polyester, or acrylic resin.

18. The display device as claimed in claim 14, wherein the gate, the first and second sources and the first and second drains comprise materials of metal, alloy, conductive polymer, or conductive carbon nanotube.

* * * * *